United States Patent [19]

Morita et al.

[11] Patent Number: 4,746,625

[45] Date of Patent: May 24, 1988

[54] A METHOD OF MANUFACTURING SEMICONDUCTOR ELEMENTS-ISOLATING SILICON OXIDE LAYERS

[75] Inventors: Sigeru Morita, Hachioji; Masakazu Kakumu, Yokohama, both of Japan

[73] Assignee: Kabushiki Kaisha Toshiba, Kawasaki, Japan

[21] Appl. No.: 15,037

[22] Filed: Feb. 17, 1987

[30] Foreign Application Priority Data

Jun. 9, 1986 [JP] Japan ................................ 61-133212

[51] Int. Cl.[4] .................. H01L 21/425; H01L 21/473
[52] U.S. Cl. ....................................... 437/63; 437/67; 437/233; 437/238; 156/653
[58] Field of Search ................. 148/DIG. 50; 437/63, 437/67, 228, 233, 238; 156/644, 646, 652, 653

[56] References Cited

U.S. PATENT DOCUMENTS 4,214,946 7/1980 Forget et al. ...................... 156/643
4,570,325 2/1986 Higuchi ................................ 357/47

FOREIGN PATENT DOCUMENTS 0022344 2/1984 Japan ............................... 29/576 W Primary Examiner—Olik Chaudhuri
Attorney, Agent, or Firm—Finnegan, Henderson, Farabow, Garrett and Dunner

[57] ABSTRACT

A semiconductor manufacturing method which comprises the steps of forming a polycrystalline silicon layer on a semiconductor substrate; depositing a silicon oxide layer on the polycrystalline silicon layer; mounting an acidproof layer on the silicon oxide layer; selectively eliminating the acidproof layer deposited on a semiconductor element-isolating region by the photoetching process; selectively eliminating the silicon oxide layer with the retained acidproof layer used as a mask; ion implanting a channel stopper impurity in the semiconductor substrate through the masks formed of a photoresist coated on the acidproof layer the acidproof layer, and silicon oxide layer; eliminating the photoresist; selectively depositing a silicon layer on the exposed polycrystalline silicon; carrying out thermal oxidation with the acidproof layer used as a mask; eliminating the acidproof layer; filling an oxide in the cavities of the side walls of the semiconductor element-isolating insulation layer; and exposing by etching that portion of the semiconductor substrate which will constitute a semiconductor element region, thereby forming a thick semiconductor element-isolating layer with high precision in a narrow semiconductor element-isolating region.

10 Claims, 2 Drawing Sheets

A METHOD OF MANUFACTURING SEMICONDUCTOR ELEMENTS-ISOLATING SILICON OXIDE LAYERS

BACKGROUND OF THE INVENTION

This invention relates to a semiconductor apparatus and the method of manufacturing the same and, more particularly, to a technique of isolating a semiconductor element formed on a semiconductor substrate.

The LOCOS (Local Oxidation of Silicon) method is widely known as a technique of isolating a semiconductor element. The LOCOS method consists in depositing an acidproof layer, for example, a silicon nitride layer ($SiN_3$ layer) on a semiconductor substrate with an insulation layer interposed therebetween, patterning the silicon nitride layer ($SiN_3$), and forming a thick, semiconductor element-isolating insulation layer by selective oxidation with the silicon nitride layer used as a mask. However, the LOCOS method has a drawback that dimensional errors arise between the width of the selective oxidation mask (silicon nitride layer) and that of the semiconductor-isolating region. Assume, for example, that the silicon nitride layer has a thickness of 2500 Å, an insulation layer (a silicon oxide layer) interposed between the semiconductor substrate (silicon substrate) and the silicon nitride layer has a thickness of 1500 Å, a semiconductor element-isolating insulation layer, when oxidized, has a thickness of 8000 Å, and the finished insulation layer for the isolation of a semiconductor element has a thickness of 5000–6000 Å. Then the above-mentioned dimensional error ranges between 0.8 to 1.6 microns. Thus, for an insulation layer for which adequately isolates the elements and which is formed by the LOCOS method, the practical width of a semiconductor element-isolating region is limited to about 2.0 microns. The LOCOS method, however, cannot isolate a semiconductor element finer than the limit width of about 2.0 microns.

It has been experimentally confirmed that a certain relationship exists between the width of a semiconductor element-isolating region and the thickness of an insulation layer applied for the isolation of the semiconductor element. When the semiconductor element-isolating region is reduced in width, the insulation layer becomes thinner, thereby presenting difficulties in ensuring the electrically sufficient property of isolating a semiconductor element. Now let it be assumed that a semiconductor element-isolating insulating layer finished under the aforementioned conditions has a width of 1.4 microns. Then, with the occurrence of crystal defects in the semiconductor substrate taken into account, the finished semiconductor element-isolating insulation layer has a thickness approximately ranging between 3000 and 3200 Å. Thus, is difficult to obtain a semiconductor element-isolating insulation layer having a greater thickness than that level.

Further it should be noted that the thickness of the semiconductor element-isolating insulation layer is determined by the relationship between the thickness and the impurity concentration of a conductivity reversion-preventing layer underlying the insulation layer. The higher the impurity concentration, the thicker the resultant semiconductor element-isolating insulation layer. If, however, the conductivity reversion-preventing layer is doped with an impurity in an indiscriminately high concentration, an electrical effect between semiconductor occurs and in operation speed of semiconductor elements will decrease, presenting disadvantages in the manufacture of semiconductor elements.

As described above, the conventional, semiconductor apparatus-manufacturing method involving the formation of a semiconductor element-isolating insulation layer by the LOCOS method has the drawbacks that noticeable dimensional errors arise. Furthermore, it is impossible to form a thick semiconductor element-isolating insulation layer in a narrow region wherein the adjacent semiconductor elements are to be isolated from each other.

SUMMARY OF THE INVENTION

This invention has been accomplished to eliminate the aforesaid drawbacks and is intended to provide a semiconductor apparatus-manufacturing method which is capable of forming a thick insulation layer for the isolation of a semiconductor element with a high precision in a narrow region wherein the adjacent semiconductor elements are to be isolated from each other. To attain the above-mentioned object, this invention provides a semiconductor-manufacturing method which comprises the steps of:

depositing a polycrystalline silicon layer on a semiconductor substrate;

mounting a silicon oxide layer on the polycrystalline silicon layer;

forming an acidproof layer on the silicon oxide layer;

selectively eliminating the acidproof layer formed on a semiconductor element-isolating region by means by photoetching;

selectively eliminating the silicon oxide layer with the retained acidproof layer used as a mask;

ion implanting a channel stopper impurity in a semiconductor substrate with the acidproof layer and silicon oxide layer used as masks;

selectively forming a silicon layer on the exposed polycrystalline silicon layer after removing said photoresist;

selectively thermally oxidizing said silicon layer and polycrystalline layer with the acidproof layer used as a mask, thereby providing a semiconductor element-isolating insulation layer;

eliminating said acidproof layer;

embedding an oxide in a concave portion formed in the side wall of said semiconductor element-isolating insulation layer; and exposing by etching that portion of the surface of the semiconductor substrate where there is to be formed a semiconductor element.

A semiconductor-manufacturing method embodying the present invention is characterized by the following. Since oxidation is applied to a silicon layer provided in a region whose side wall is surrounded by an acidproof layer, it is possible to reduce dimensional errors. Moreover the semiconductor substrate itself is only slightly oxidized, minimizing the occurrence of crystal defects in the substrate. Further, a silicon layer acting as a semiconductor element-isolating insulation layer can be grown with its thickness properly controlled. Namely, the thickness of the semiconductor element-isolating silicon layer can be easily controlled even in an extremely small semiconductor element-isolating region, thereby enabling the silicon layer to be grown with a sufficient thickness for the electric isolation of a semiconductor element.

BRIEF DESCRIPTION OF THE DRAWINGS

The present invention will be explained below with reference to FIGS. 1A to 1H.

DETAILED DESCRIPTION OF THE PREFERRED EMBODIMENT

Figure 1A:
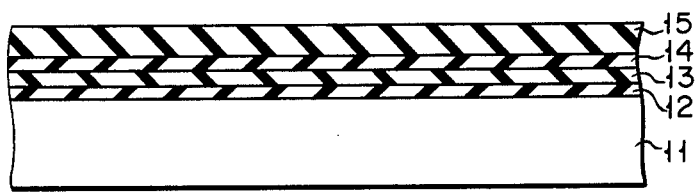
FIGS. 1A to 1H show the steps of manufacturing an insulating layer for element isolation.

Description may now be made of a semiconductor apparatus-manufacturing method embodying this invention with reference to the appended FIGS. 1A–1H indicating the sequential steps of said manufacturing process.

First, the main surface of silicon substrate 11 of P type Miller indice (100) having a specific resistivity of 1–2 $\Omega$·cm is oxidized in an atmosphere of $O_2$ held at a temperature of 1000° C., thereby providing first silicon oxide layer 12 (having a thickness of 500 Å) for the protection of the surface of the silicon substrate 11. Next, polycrystalline silicon layer 13 is formed with a thickness of 750 Å on the silicon oxide layer 12 by the vapor phase growth process. Later, the surface of the polycrystalline silicon layer is oxidized in an atmosphere of $O_2$ held at a temperature of 1000° C., thereby forming second silicon oxide layer 14 with a thickness of 500 Å. Further, silicon nitride layer 15 is deposited on the second silicon oxide layer 14 by the vapor phase growth process. The above-mentioned steps provide a structure illustrated in FIG. 1A.

Figure 1B:
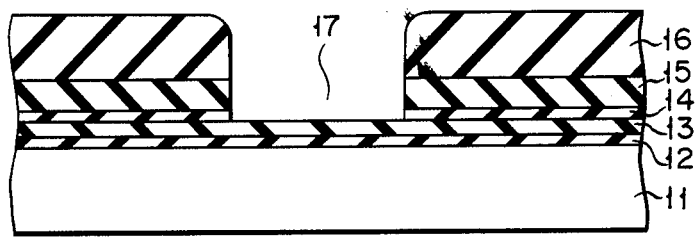

Thereafter, that portion of silicon nitride layer 15 provided which corresponds to a semiconductor element-isolating region to be formed is selectively removed by photoetching based on reactive ion etching (anisotropic etching) involving the application of fluorine gas with photoresist 16 used as a mask. Later, silicon oxide layer 14 is eliminated with the retained silicon nitride layer 15 used as a mask, thereby providing opening 17 (FIG. 1B).

Figure 1C:
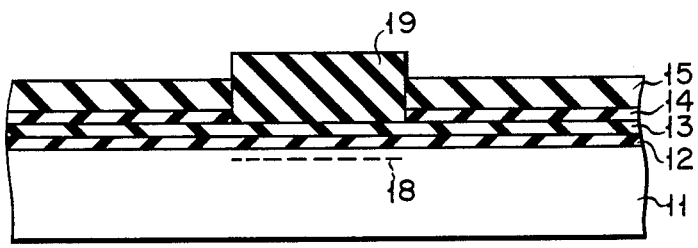

Impurity (B+) 18 intended for the prevention of the reversion of conductivity is ion implanted in that portion of silicon substrate 11 which constitutes a semiconductor element-isolating region with a dose of about $5 \times 10^{12}$ cm$^{-2}$ with acceleration voltage of 100 keV, penetrating polycrystalline silicon layer 13 and silicon oxide layer 12. In this step, photoresist, silicon nitride layer 15 and silicon oxide layer 14 are used as masks (FIG. 1C). Thereafter, polycrystalline (or single crystal) silicon layer 19 is deposited with a thickness of about 3000 Å by the selective epitaxial growth process only on that portion of polycrystalline silicon layer 13 which is exposed in the opening 17. As a result, the side walls of polycrystalline silicon layer 19 are brought into contact with silicon nitride layer 15.

Figure 1D:
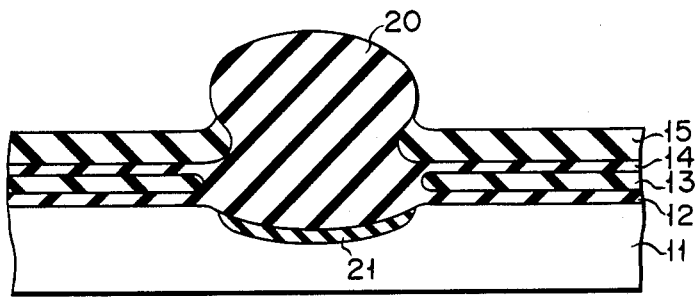

Selective oxidation is performed through exposed polycrystalline silicon layers 19 and 13 to a depth of about 250 Å from a surface of silicon substrate 11 in an atmosphere of $H_2+O_2$ held at a temperature of 1000° C. with silicon nitride layer 15 used as a mask for selective oxidation, thereby forming semiconductor element-isolating silicon oxide layer 20 (insulation layer) with a thickness of 8000 Å. At this time, impurity (B+) 18 previously implanted in silicon substrate 11 in the aforementioned step is diffused and activated, thereby providing conductivity reversion-preventing layer 21 (FIG. 1D).

Figure 1E:
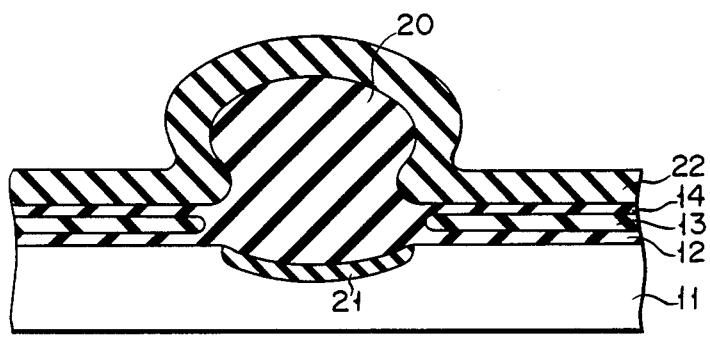

Later, silicon nitride layer 15 which is no longer needed is selectively eliminated by the chemical dry etching process involving the application of fluorine gas (isotropic etching process). Thereafter polycrystalline silicon layer 22 is deposited on the aforementioned semiconductor element-isolating silicon oxide layer 20 and silicon oxide layer 14 by the vapor phase growth process with a thickness of about 2000 Å (FIG. 1E).

Figure 1F:
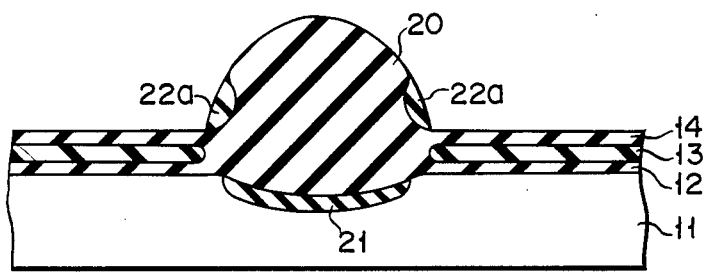

Thereafter, polycrystalline silicon layer 22 is eliminated by the reactive ion etching process involving the application of a gas of chlorine series. Since this etching is carried out anisotropically, polycrystalline silicon portions 22a are retained only in the annular groove formed on the side walls of semiconductor element-isolating silicon oxide layer 20 when silicon nitride layer 15 was eliminated. As a result, annular groove 22a is filled up, causing semiconductor element-isolating silicon oxide layer 20 to have a smooth surface (FIG. 1F).

Figure 1G:
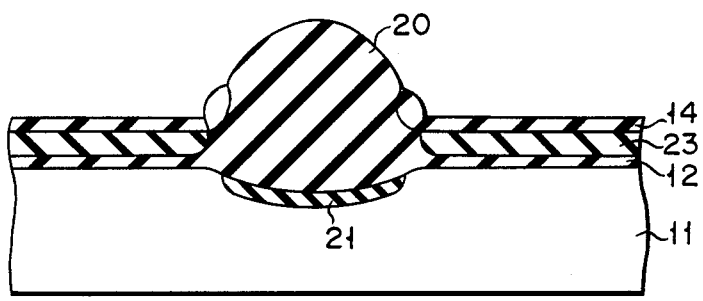
Figure 1H:
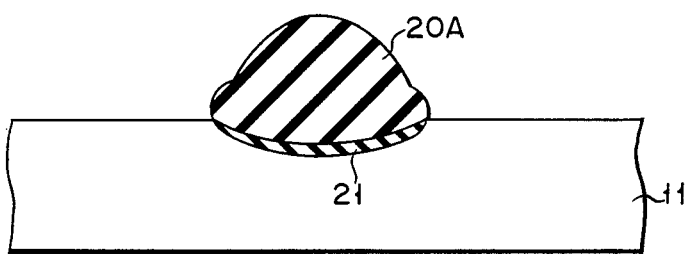

Later, thermal oxidation is performed in an atmosphere of $O_2$ held at a temperature of 1000° C., thereby oxidizing all of polycrystalline silicon layer 13 retained on the semiconductor element region to provide silicon oxide layer 23. Since polycrystalline silicon portions 22a are extremely thinner and smaller than polycrystalline silicon layer 13, all polycrystalline silicon portions 22a are turned into a silicon oxide layer when polycrystalline silicon layer 13 is oxided, thus constituting part of semiconductor element-isolating silicon oxide layer 20 (FIG. 1G).

When silicon oxide layers 14, 23, 12 are eliminated by a solution of $NH_4F$ until that portion of silicon substrate 11 which is retained in the semiconductor-forming region is exposed, than a silicon oxide layer, that is semiconductor element-isolating silicon oxide layer 20A is retained only on semiconductor-isolating region, because a thickness of the semiconductor element-isolation silicon oxide layer 20 is different from a total thickness of silicon oxide layers 14, 23, 12.

Later, a semiconductor element (such as an MOS type transistor or a bipolar type transistor) in accordance with conventional semiconductor apparatus-manufacturing processes, and the respective elements are connected together (for example, aluminum wiring) to complete a semiconductor apparatus.

The above-mentioned process is characterized in that polycrystalline silicon layer 19 is formed in an opening provided by selectively etching silicon nitride layer 15 by the epitaxial growth method as mentioned above. In this case, the side wall of said polycrystalline silicon layer 19 directly contacts silicon nitride layer 15. Later, polycrystalline silicon layer 19 is selectively oxidized to form a semiconductor element-isolating silicon oxide layer (semiconductor element-isolating insulating layer) 20. At this time, the oxidation of silicon substrate 11 is not started, until polycrystalline silicon layer 19 is completely oxidized. Even if, therefore, it is attempted to provide a semiconductor element-isolating oxide layer 20 with a sufficient thickness to ensure a perfect electrical insulation between semiconductor elements, the occurrence of the so-called bird's beak is assuredly more reduced than when the LOCOS method is applied.

When polycrystalline silicon layer 19 is oxidized, silicon nitride layer 15 surrounding polycrystalline silicon layer 19 is not oxidized. Therefore, the volumetric increase of polycrystalline silicon layer 19 resulting from oxidation does not cause the inner walls of hole 17 formed in silicon nitride 15 to be pushed crosswise but inevitably causes said inner walls to extend upward. Consequently, a noticeable decrease is realized in a difference between the width of hole 17 provided before the oxidation of polycrystalline layer 19 and the width of semiconductor element-isolating silicon oxide layer 20 formed after the oxidation of polycrystalline silicon layer 19.

As mentioned above, silicon substrate 11 is oxidized only a little when polycrystalline silicon layer 19 is oxidized. Therefore, silicon substrate 11 does not undergo mechanical stresses which might otherwise arise from the volumetric expansion caused by its oxidation. Further, complete electric insulation is ensured between semiconductor elements deposited on the semiconductor element-forming region. Therefore, a sufficiently thick semiconductor element-isolating silicon oxide layer can be formed without the drawbacks accompanying the conventional LOCOS method.

Specifically, the width of a semiconductor element-isolating region realized by the aforementioned embodiment of the present invention can be reduced up to 1.2 microns. Furthermore, the semiconductor element-isolating insulation layer (silicon oxide layer) can have a thickness of 5000 Å. Additionally, it has been confirmed that that thickness sufficiently serves the purpose of electrically isolating semiconductor elements; the crystal defects of the semiconductor substrate (silicon substrate) occur only to such extent that the property of a semiconductor element is little affected in all practically; and the difference between the designed measurements of the masking material (a silicon nitride layer) for the selective oxidation of a semiconductor element-isolating insulation layer and those of the actually fabricated masking material can be extremely minimized to an extent of 0.2 to 0.4 microns.

The foregoing embodiment referred to the case where a deposited polycrystalline silicon layer was subjected to the reactive ion etching process for the formation of a semiconductor element-isolating insulation layer. However, it is possible to carry out the reactive ion etching process after the deposition of a silicon oxide layer by the vapor phase growth method. In the foregoing embodiment, silicon oxide layer 12 was deposited on the surface of a silicon substrate for protection. However, this step is unnecessary if the silicon substrate is not likely to be contaminated by foreign matter in the other steps.

What is claimed is:

1. A method of manufacturing semiconductor element-isolating silicon oxide layers comprising the steps of:

forming a first silicon oxide layer on a semiconductor substrate;

depositing a first polycrystalline silicon layer on said first silicon oxide layer;

forming a second silicon oxide layer on said first polycrystalline silicon layer;

providing an acidproof layer on said second silicon oxide layer;

selectively eliminating that portion of said acidproof layer corresponding to a semiconductor element-isolating region to be formed;

selectively removing said second silicon oxide layer with the retained portion of said acidproof layer used as a mask thereby exposing a portion of said first polycrystalline silicon layer;

ion-implanting an impurity used for forming a channel stopper in the semiconductor substrate by applying a photoresist coated on said acidproof layer during the selective elimination of the portion of said acidproof layer, said acidproof layer and second silicon oxide layer all used as masks;

selectively growing a silicon layer on said exposed portion of said first polycrystalline silicon layer after the elimination of said photoresist;

subjecting said silicon layer and said first polycrystalline layer to selective thermal oxidation with said retained portion of said acidproof layer used as a mask thereby forming a semiconductor element-isolating insulation layer having an annular groove;

eliminating said retained portion of said acidproof layer;

filling said annular groove in the side walls of said semiconductor element-isolating insulation layer with a silicon oxide; and exposing by etching that portion of the surface of the semiconductor substrate which is formed to be a semiconductor element region.

2. The method according to claim 1, wherein said first polycrystalline silicon layer is formed by the epitaxial growth process.

3. The method according to claim 1, wherein the step of forming said second silicon oxide layer on said first polycrystalline silicon layer is performed by oxidizing the surface of said first polycrystalline silicon layer in an atmosphere of oxygen.

4. The method according to claim 1, wherein the step of selectively eliminating said portion of said acidproof layer corresponding to said semiconductor element-isolating region to be formed is carried out by the reactive ion etching process using fluorine gas.

5. The method according to claim 1, wherein the step of filling a silicon oxide in said annular groove of the side walls of said semiconductor element-isolating insulation layer involves the processes of depositing a second polycrystalline silicon layer on the whole surface of said semiconductor substrate, eliminating said second polycrystalline silicon layer by an anisotropic etching process except for that portion formed in said annular groove, and converting the polycrystalline silicon layer retained in said annular groove of the side walls into silicon oxide by thermal oxidation.

6. The method according to claim 1, wherein the step of filling a silicon oxide in said annular groove of the side walls of said semiconductor element-isolating insulation layer involves the processes of mounting a third silicon oxide layer on the whole surface of said semiconductor substrate and eliminating by anisotropic etching said silicon oxide layer except for that portion formed in said annular groove.

7. The method according to claim 1, wherein the selective oxidation of said silicon layer and said first polycrystalline silicon layer to provide a semiconductor element-isolating insulation layer is continued until part of said semiconductor substrate is oxidized.

8. The method according to claim 1, wherein said acidproof layer is a silicon nitride layer.

9. The method according to claim 1, wherein said silicon layer is formed of a polycrystalline layer.

10. The method according to claim 1, wherein said silicon layer consists of a single crystal silicon layer.

* * * * *